United States Patent
Bartell et al.

(10) Patent No.: US 10,326,423 B1
(45) Date of Patent: Jun. 18, 2019

(54) IMPEDANCE MATCHING CIRCUITS FOR PHOTONIC DEVICES

(71) Applicant: Precision Integrated Photonics, Inc., Rochester, NY (US)

(72) Inventors: Barrett Bartell, Mendon, NY (US); David M. Calhoun, Victor, NY (US)

(73) Assignee: Precision Integrated Photonics, Inc., Rochester, NY (US)

( * ) Notice: Subject to any disclaimer, the term of this patent is extended or adjusted under 35 U.S.C. 154(b) by 2 days.

(21) Appl. No.: 15/960,206

(22) Filed: Apr. 23, 2018

(51) Int. Cl.
  *H03H 7/38* (2006.01)
  *G02B 6/122* (2006.01)
  *H04B 10/516* (2013.01)
  *G02B 6/12* (2006.01)

(52) U.S. Cl.
  CPC .............. *H03H 7/38* (2013.01); *G02B 6/122* (2013.01); *H04B 10/516* (2013.01); *G02B 2006/12123* (2013.01); *G02B 2006/12142* (2013.01)

(58) Field of Classification Search
  CPC .......... G02B 6/122; G02B 2006/12123; G02B 2006/12142; H04B 10/516; H03H 7/38
  USPC .......................................................... 385/14
  See application file for complete search history.

(56) References Cited

U.S. PATENT DOCUMENTS

| | | | |
|---|---|---|---|
| 5,444,564 A | 8/1995 | Newberg | |
| 6,912,918 B1* | 7/2005 | Lynnworth | G01F 1/3218 73/861.26 |
| 7,724,179 B2 | 5/2010 | Williams et al. | |
| 2003/0095737 A1* | 5/2003 | Welch | B82Y 20/00 385/14 |
| 2017/0302245 A1* | 10/2017 | Sadler | H03H 7/383 |

* cited by examiner

*Primary Examiner* — Jerry M Blevins
(74) *Attorney, Agent, or Firm* — Fox Rothschild LLP; Robert J. Sacco; Carol E. Thorstad-Forsyth

(57) ABSTRACT

Performance of a photonic integrated circuit (PIC) is improved by using at least one electro-optic (EO) device included in the PIC to perform at least one EO conversion operation whereby an information signal is transitioned from a first signal carrier type to a second signal carrier type different from the first signal carrier type. The first and second signal carrier types are selected from the group consisting of an optical signal carrier and an electrical signal carrier. An operating bandwidth of the PIC is increased by performing electrical signal impedance matching operations directly on the at least one optical media substrate. An improved electrical impedance match is thus obtained between the EO device and a second device exclusive of the PIC.

20 Claims, 6 Drawing Sheets

IMPEDANCE MATCHING CIRCUITS FOR PHOTONIC DEVICES

BACKGROUND

Statement of the Technical Field

The technical field of this disclosure comprises electro-optical systems and more particularly methods and systems for improving the performance of such systems.

Description of the Related Art

Photonic integrated circuits (PICs) are devices in which numerous optically interconnected components perform various optical processing functions. As such, a PIC can include many different functional optical devices including passive and active devices. Passive devices can include waveguides, filters, and switches, attenuators, multiplexors and de-multiplexors, among others. Active devices included on a PIC can include laser optical sources, amplifiers, modulators, detectors, waveguides and so on. These components are commonly disposed on a photonic media substrate using monolithic, hybrid or modular integration techniques. Devices in which all of the interconnected optical components are manufactured on a single common substrate are known as monolithic PICs. Monolithic integration is often difficult to achieve in practice and therefore alternative approaches are often adopted. Non-monolithic PICs are generally referred to as hybrid PICs and can be comprised of multiple photonic substrate material types. The utilization of different photonic substrate material types in the hybrid PIC can be helpful because the different materials facilitates the fabrication of certain types of devices. Conventional substrate materials used in production of monolithic PICs include Gallium arsenide (GaAs) and Indium Phosphide (InP). Substrate materials used in hybrid PIC production commonly include lithium niobate, silicon, glass and polymer materials.

Compared with electronic integrated circuits, PICs can offer increased bandwidth and lower power consumption. PICs also can be connected to electronic circuits (e.g., electronic integrated circuits) to allow for the development of multifunctional systems that take advantage of the best features of both technology types.

Optical modulation involves applying information to a light wave. In some scenarios, information carried by an electrical signal can be applied directly to the power source of a lightwave emitter (e.g., a photodiode) to produce a desired modulation of the light beam. Alternatively, the electrical signal can be used to indirectly manipulate the phase, frequency, amplitude or polarization of the light beam. Photodetectors are used to detect optical signals and convert them to electrical signals. Photodiodes are a commonly used type of photodetector. Current amplifiers (also called transimpedance amplifiers) are often used as preamplifiers for photodiodes.

SUMMARY

This document concerns a method for improving performance of a photonic integrated circuit. The method involves performing one or more optical operations in a photonic integrated circuit (PIC) disposed on at least one optical media substrate. At least one electro-optic (EO) device included in the PIC is used to perform at least one EO conversion operation whereby an information signal is transitioned from a first signal carrier type to a second signal carrier type different from the first signal carrier type. The first and second signal carrier types are selected from the group consisting of an optical signal carrier and an electrical signal carrier. The method further involves increasing an operating bandwidth of the PIC by performing electrical signal impedance matching operations directly on the at least one optical media substrate to improve an electrical impedance match between the EO device and a second device exclusive of the PIC. According to one aspect, the EO conversion operation and the electrical signal impedance matching operations are performed on the same optical media substrate. The method can further involve performing the electrical signal impedance matching operation directly at an impedance mismatch boundary associated with the EO device.

In the solution presented herein, the EO device can be an optical modulator and/or a photo-diode. If the EO device is an optical modulator, then the impedance matching operations can involve improving the electrical impedance match of an input electrical impedance of the optical modulator relative to an output electrical impedance of the second device. Alternatively, if the EO device is a photo-diode (e.g., a photo-diode) functioning as a photodetector in the PIC, then the impedance matching operations can comprise matching an output electrical impedance of the photo-diode to an input electrical impedance of the second device.

The electrical signal impedance matching operations described herein are performed using one or more discrete lumped element electronic components. These components are disposed directly on the optical media substrate and may be selected from the group consisting of an inductor, a capacitor, and a resistor. Since lumped element component are used, they can advantageously have physical dimensions that are less than $0.25\lambda$, where $\lambda$ is the wavelength of the electrical signal carrier which is processed by on the optical substrate.

According to another aspect, a solution disclosed herein concerns a photonic integrated circuit (PIC). The PIC is comprised of at least one optical media substrate. For example, one optical media substrate may be in use in monolithic PIC whereas a plurality of optical media substrates may be used in scenarios involving a hybrid PIC (also known as a multi-chip module). A plurality of optical processing elements are disposed on the at least one optical media substrate, including at least one ED device. The ED device is configured to perform at least one ED conversion operation in which an information signal is transitioned from a first signal carrier type to a second signal carrier type different from the first signal carrier type. For example, the first and second signal carrier types can be selected from the group consisting of an optical signal carrier and an electrical signal carrier. In a solution presented herein, an electrical impedance matching network is advantageously disposed directly on the at least one optical media substrate.

The electrical impedance matching network is configured to facilitate a broadband electrical impedance match between the ED device and a second device exclusive of the PIC. In some scenarios, the ED device and the electrical impedance matching network are disposed on the same optical media substrate. According to one aspect, the electrical impedance matching network can be connected directly at the impedance mismatch boundary associated with the ED device.

In a PIC as disclosed herein the ED device can be selected from the group consisting of an optical modulator and a photo-diode. If the ED device is an optical modulator, then the electrical impedance matching network can be configured to improve the electrical impedance match of an input electrical impedance of the optical modulator relative to an output electrical impedance of the second device. If the ED device is a photo-diode (e.g., a photo-diode functioning as a photodetector in the PIC), then the electrical impedance matching network can be configured to match an output electrical impedance of the photo-diode to an input electrical impedance of the second device.

The electrical impedance matching network is advantageously comprised of one or more discrete lumped element electronic components. These components are disposed directly on the optical media substrate and can include one or more inductors, capacitors, and/or resistors. Since the components are of the lumped element type it will be appreciated that they will have physical dimensions that are less than 0.25λ, where λ is the wavelength of the electrical signal carrier.

BRIEF DESCRIPTION OF THE DRAWINGS

This disclosure is facilitated by reference to the following drawing figures, in which like numerals represent like items throughout the figures, and in which.

DETAILED DESCRIPTION

Figure 1:
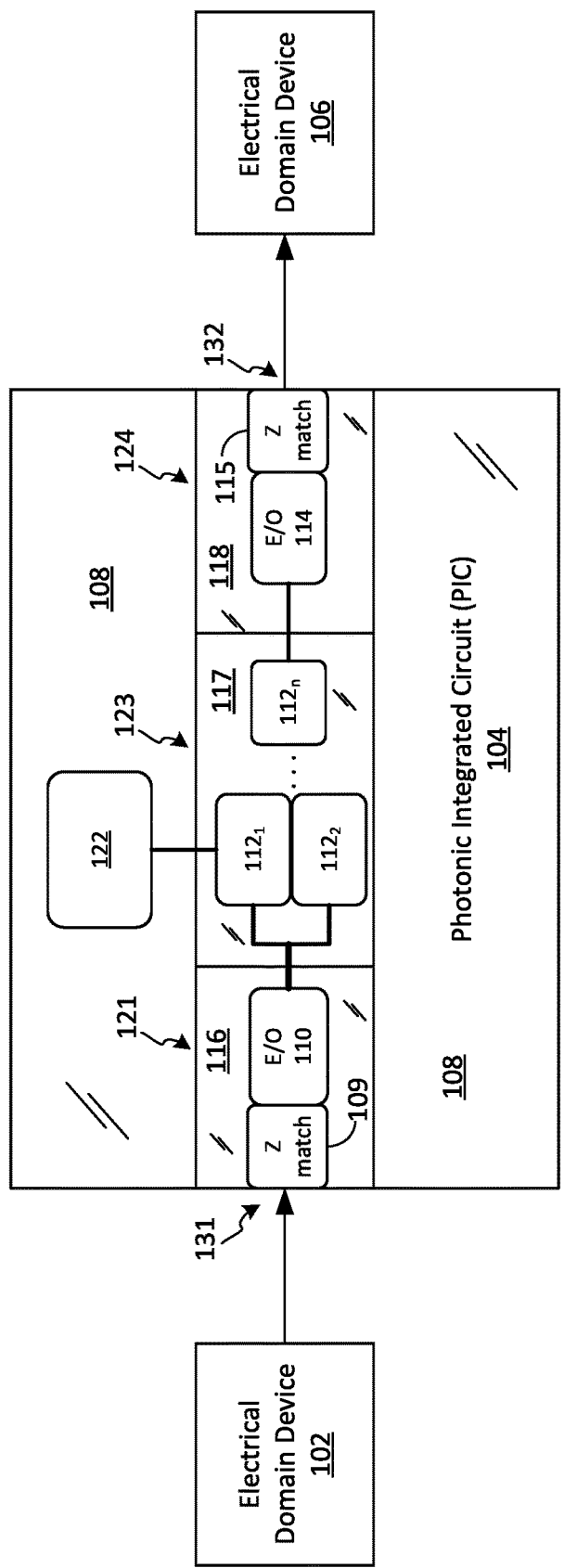
FIG. 1 is a block diagram that is useful for understanding how impedance matching can be used within a photonic integrated circuit.

It will be readily understood that the components of the systems and/or methods as generally described herein and illustrated in the appended figures could be arranged and designed in a wide variety of different configurations. Thus, the following more detailed description, as represented in the figures, is not intended to limit the scope of the present disclosure, but is merely representative of certain implementations in various different scenarios. While the various aspects are presented in the drawings, the drawings are not necessarily drawn to scale unless specifically indicated.

One area of growing interest within the photonics field involves using PICs to perform in the optical domain certain operations with respect to radio frequency (RF) signals (e.g., microwave and millimeter wave RF signals). Such systems represent a departure from conventional photonic systems and present many technical challenges. For example, a conventional hybrid PIC can in some scenarios include an electronic digital data processing circuit. But due to the concentration of signal energy at baseband, such digital data processing systems do not present the same kinds of technical challenges as the integration of photonics with RF signals and circuits. RF signal integrity requires special considerations which are not easily solved and have not previously been addressed in the context of a PIC.

RF over fiber (RFoF) is technique whereby a continuous wave optical signal is modulated by a radio frequency signal. Such a modulated optical signal can then be transmitted, using an optical fiber, over a relatively large distance. An advantage of this technique is that the modulated optical signal can be communicated over such distances with considerably less concern for transmission losses, noise and electromagnetic interference. Optical systems offer the possibility of exceptionally wide bandwidth to facilitate broadband communications. However, it has been determined that conventional communication networks utilizing RFoF can still experience bandwidth limitations due to insufficient consideration of the integration requirements of RF equipment and the PICs that are used to facilitate such networks. Accordingly, a solution disclosed herein whereby performance of such networks is improved by augmenting the practical operational bandwidth of a PIC.

As is known, a PIC is comprised of at least one photonic media substrate. Various optical processing elements can be disposed on the photonic media substrate, including at least one electro-optic (EO) device. The EO device is one which is configured to perform at least one EO conversion operation where an information signal is transitioned from a first signal carrier type (electrical or optical) to a second signal carrier type (electrical or optical) different from the first signal carrier type. As such, the term EO device as used herein refers to one which can perform a conversion from an optical signal to an electrical signal, or an electrical signal to an optical signal. In the solution disclosed herein, an electrical impedance matching network is provided directly on at least one optical media substrate and configured to facilitate a broadband electrical impedance match between the EO device and a second device exclusive of the PIC. The impedance matching described herein facilitates a broadband impedance match on the photonic substrate, directly at the impedance mismatch boundary. This improves the operating bandwidth of the PIC which can be otherwise limited by the impedance mismatch. Accordingly, practical bandwidth limitations associated with RFoF networks can be improved.

FIG. 1 shows a photonic integrated circuit. Photonic integrated circuits in which all of the interconnected optical components are manufactured on a single common photonic substrate are known as monolithic PICs. Non-monolithic PICs are generally referred to as hybrid PICs and can be comprised of multiple substrate material types. Shown in FIG. 1 is a hybrid photonic integrated circuit (PIC). Although a hybrid PIC is shown, it should be noted that the solution disclosed herein can be applied to monolithic PICs and/or hybrid PICs.

The hybrid PIC 104 includes a plurality of photonic integrated circuits 121, 122, 123, 124 disposed on a photonic media substrate 108. In a hybrid integration scenario as shown, different PICs can be fabricated on separate wafer photonic media substrates 116, 117, 118 which are comprised of different materials. The various PICs can then be combined mechanically on a base substrate 108 to make the final device. The fabrication of hybrid PICs is well-known in the art and in fact parallels or directly matches the even-better known art of electronic multiple chip modules (MCMs). Accordingly, these fabrication methods will not be described in detail.

Each PIC 121-124 can contain multiple optically interconnected components which are fabricated on a particular substrate. These interconnected components function cooperatively to perform certain optical signal processing functions. In some scenarios, one or more optical waveguides can be formed in one or more of the photonic media substrates to facilitate communication of optical signals among the various PICs 121-124 which comprise the hybrid PIC 104. The exact wavelength of the optical signals used herein is not critical. However, the wavelength can be selected so that it is suitable for operation given the material properties comprising each PIC and the particular photonic substrate. In some scenarios, the optical signals can be in the visible or near infra-red wavelength ranges.

Each PIC 121-124 can include a plurality of various different functional optical devices $112_1 \ldots 112_n$, which can include both passive and active devices. Passive optical devices can include waveguides, filters, switches, attenuators, multiplexors and de-multiplexors, among others. Active optical devices included on a PIC as disclosed herein can include laser optical sources, amplifiers, modulators, detectors, waveguides and so on.

Photonic substrates 108, 116, 117, 118 can be any substrate now known or known in the future which is suitable for integrated waveguide light transport and PIC device integration. Exemplary materials suitable for this purpose can include Lithium Niobate, Silicon (Si), glass, and polymeric materials. Other materials can include Silica, Gallium Arsenide (GaAs) or Indium Phosphide (InP) which are sometimes referred to as III-V compounds since they are composed of elements arranged in columns III and V of the periodic table. Various systems for integrating photonic waveguides and fabricating photonic integrated circuits (PICS) in a photonic substrate are well-known and therefore will not be described here in detail. However, it will be appreciated that such processes can involve various operations including activation (doping), epitaxial growth, waveguide etching, passivation and planarization, metallization and interconnect steps.

To facilitate functions associated with the I/O ports 131, 132 a PIC 104 can include one or more electro-optic (EO) interface devices 110, 114. As used herein, an EO interface device broadly refers to any device included in the PIC which performs at least one EO conversion operation whereby an information signal is transitioned from a first signal carrier type (e.g., electrical or optical) to a second signal carrier type (e.g., electrical or optical) different from the first signal carrier type. Stated differently, it can be said that the EO conversion operation involves a transition as between an optical signal carrier type and an electrical signal carrier type. As such, an EO conversion operation as described herein can involve a conversion from the electrical domain to the optical domain, or a conversion from the optical domain to the electrical domain. Examples of EO conversion devices can include both an optical modulator and a photodetector.

As is known, an optical modulator is an electro-optical conversion device which uses a signal in the electrical domain to modulate an optical carrier. In some scenarios, the optical modulator can make use of an electro-optic effect such that an electrical signal (e.g., a modulated RF signal) can be imposed on the phase, frequency, and/or amplitude of the optical beam. Optical modulators are well-known and therefore will not be described here in detail. However, it should be understood that an electro-optic effect used to facilitate such modulation can be a change or modification of a refractive index associated with an optical waveguide. In some scenarios, an optical waveguide in the optical modulator can be comprised of a material such as lithium niobate, which is known to have a refractive index that varies in the presence of an electric field.

A photodetector is an optical to electrical signal converter which receives a modulated optical signal as an input and in response thereto, generates an electrical signal as an output. For example, the photodetector can in some scenarios generate a modulated RF signal from the modulated optical carrier. Photodetectors as referenced herein are well known in the art and therefore will not be described detail. However, it should be understood that such devices will commonly include a solid state semiconductor element which varies an electric current responsive to the incident optical signal. A photodiode is one example of a type of photodetector.

In an example scenario shown in FIG. 1, the input/output (I/O) port 131 is configured as an input port for the PIC 104 to facilitate an interface for receiving electronic signals (e.g. a millimeter wave or microwave RF signal) from an electrical domain device 102. Electrical domain device 102 can be any type of device that processes signals in the electronic domain and provides them to the PIC 104 at I/O port 131. In the scenario shown in FIG. 1, I/O port 132 is configured as an output port for the PIC 104 to facilitate an interface for communicating electronic signals to an electrical domain device 106. Electrical domain device 106 can be any type of active or passive device that processes signals in the electronic domain. Accordingly, in the example scenario shown in FIG. 1, E/O device 110 can comprise an optical modulator and E/O device 114 can comprise a photodetector (e.g., a photodiode).

Figure 2:
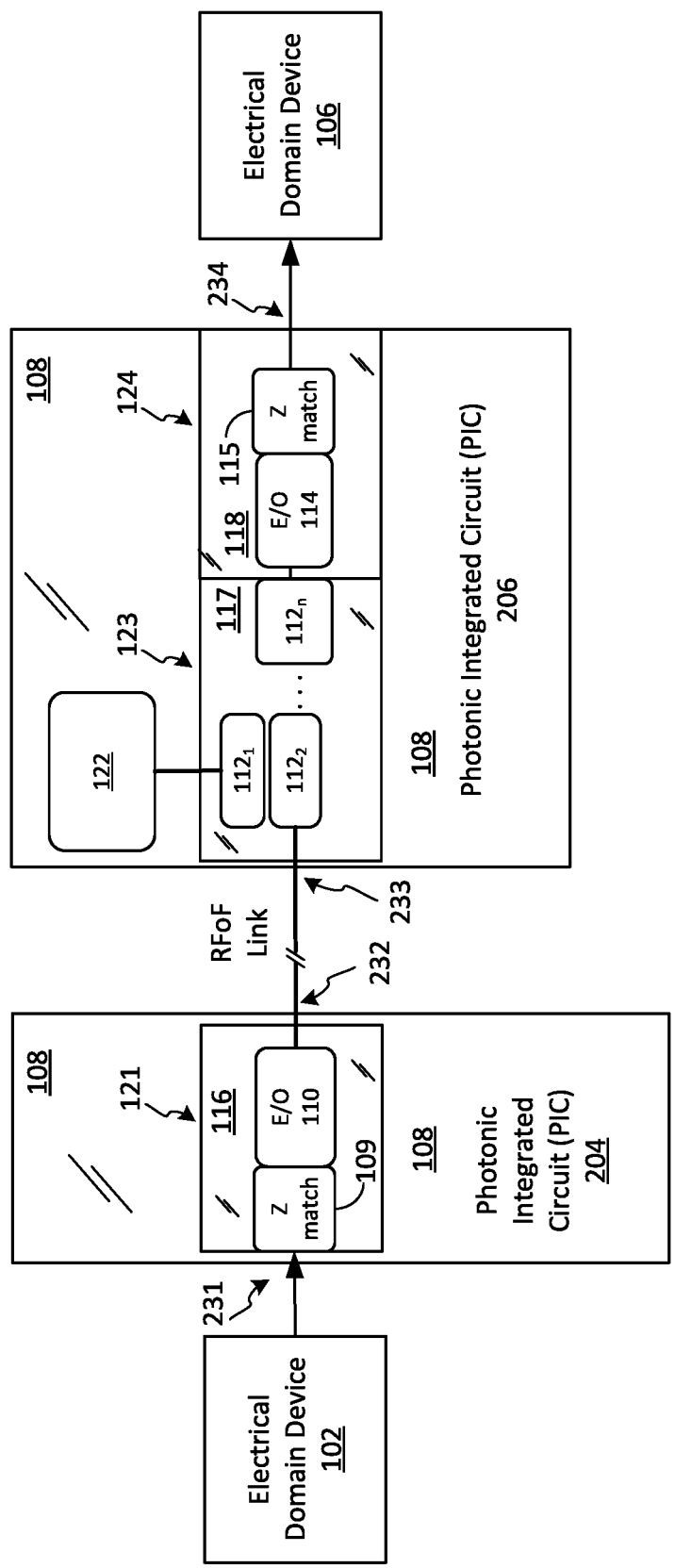
FIG. 2 is a block diagram of a communication network which is useful for understanding how impedance matching an electro-optic interface can improve network bandwidth.

FIG. 2 shows a different arrangement in which an RFoF link facilitates communications between a first PIC 204 and a second PIC 206. In FIG. 2 similar components are identified with the same reference numbers as in FIG. 1. As such, a hybrid PIC 204, 206 can include one or more PICs 121, 122, 123, 124 disposed on substrates 108, 116, 117, 118. Each PIC can comprise one or more different functional optical devices $112_1 \ldots 112_n$, which can include both passive and active devices. PICs 204, 206 can include I/O ports, including electrical I/O ports 231, 234 and optical I/O ports 232, 234. In the scenario shown in FIG. 2, it will be appreciated that an RF signal provided by electrical domain device 102 can be converted to a modulated optical carrier signal at E/O 110, transported over RFoF link 205, and then can be restored as an RF signal at E/O 114. In the scenario shown in FIG. 2, E/O 110 would be an optical modulator and E/O 114 would be a photodetector. A system as shown in FIG. 2 can be effective for communicating an RF signal over an optical fiber link. However, the bandwidth of the overall network can be limited by ability of the electrical domain device 102 to effectively communicate RF energy to the E/O 110 and by the ability of the E/O 114 to effectively communicate electrical energy to the electrical domain device 106.

PICs 204, 206 must have electrical I/O ports 231, 234 to be able to receive and transmit electrical energy. However, an interface between an electrical domain device 102, 106 and a PIC 204, 206 can produce unwanted, frequency dependent loss due to reflected energy at these ports. Such reflections can be caused by an impedance mismatch. For example, such a mismatch may exist if the PIC 204 input impedance does not match the source impedance of the electrical domain device 102, or if the PIC 206 output impedance does not match the input impedance of the electrical domain device 106. In such scenarios, energy may be reflected at the boundary of the impedance discontinuity, and such reflections will limit the usable bandwidth of the overall network. In other words, the overall network bandwidth may be limited even though such limitations are not present internally within the PICs 204, 206.

Impedance match or mismatch at I/O ports 231, 234 is each characterized by the reflection coefficient gamma (Γ). Gamma is defined as the ratio of reflected voltage ($V_r$) to incident voltage ($V_i$). Γ can also be determined in terms of source ($Z_0$) and load ($Z_L$) impedance as follows:

$$\Gamma = \frac{Z_L - Z_0}{Z_L + Z_0}$$

Figure 3:
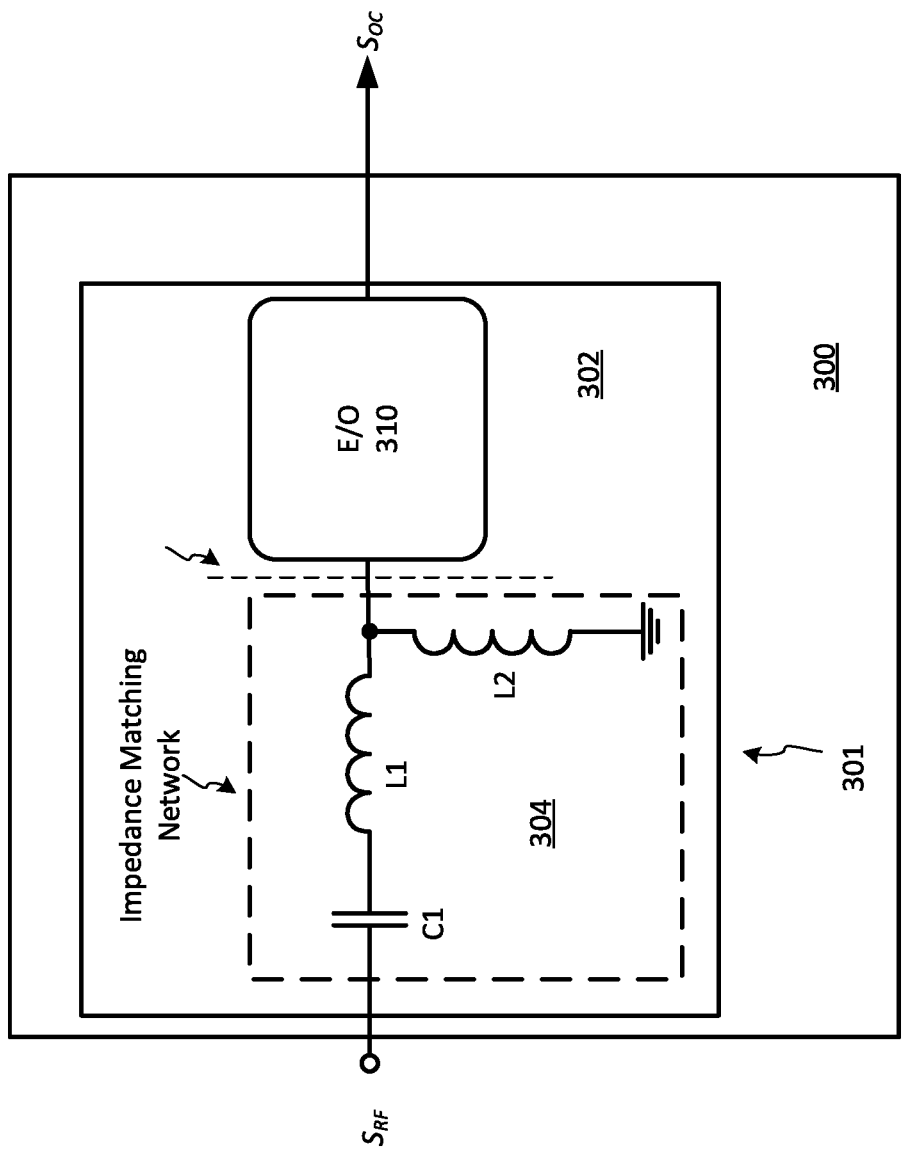
FIG. 3 is a schematic drawing which is useful for understanding how impedance matching at an input of a photonic integrated circuit can be performed on a photonic substrate at an impedance boundary with an electro-optic device.

In FIGS. 1 and 2, impedance matching the electrical I/O ports of the PICs 104, 204, 206 to an associated electrical domain device 102, 106 can improve the overall operational bandwidth of an individual PIC 104, 204, 206, and/or an overall operational bandwidth of a communication network 200. In particular, electrical impedance matching should be performed at the impedance boundary with the optical modulator and/or photodetector in such devices. Impedance matching can be accomplished by placing impedance match circuits 109, 116 at the impedance mismatch boundary, directly on the photonic substrate of the PIC. As shown in FIG. 3, the impedance match circuits can include circuit elements such as inductors, capacitors and resistors at the impedance mismatch boundary. To achieve best performance, the matching circuit is advantageously placed as close as possible to the particular photonics device. At microwave (3-30 GHz) and millimeter wave (30-300 GHz) frequencies, these circuit elements can also be realized using transmission lines.

Figure 4:
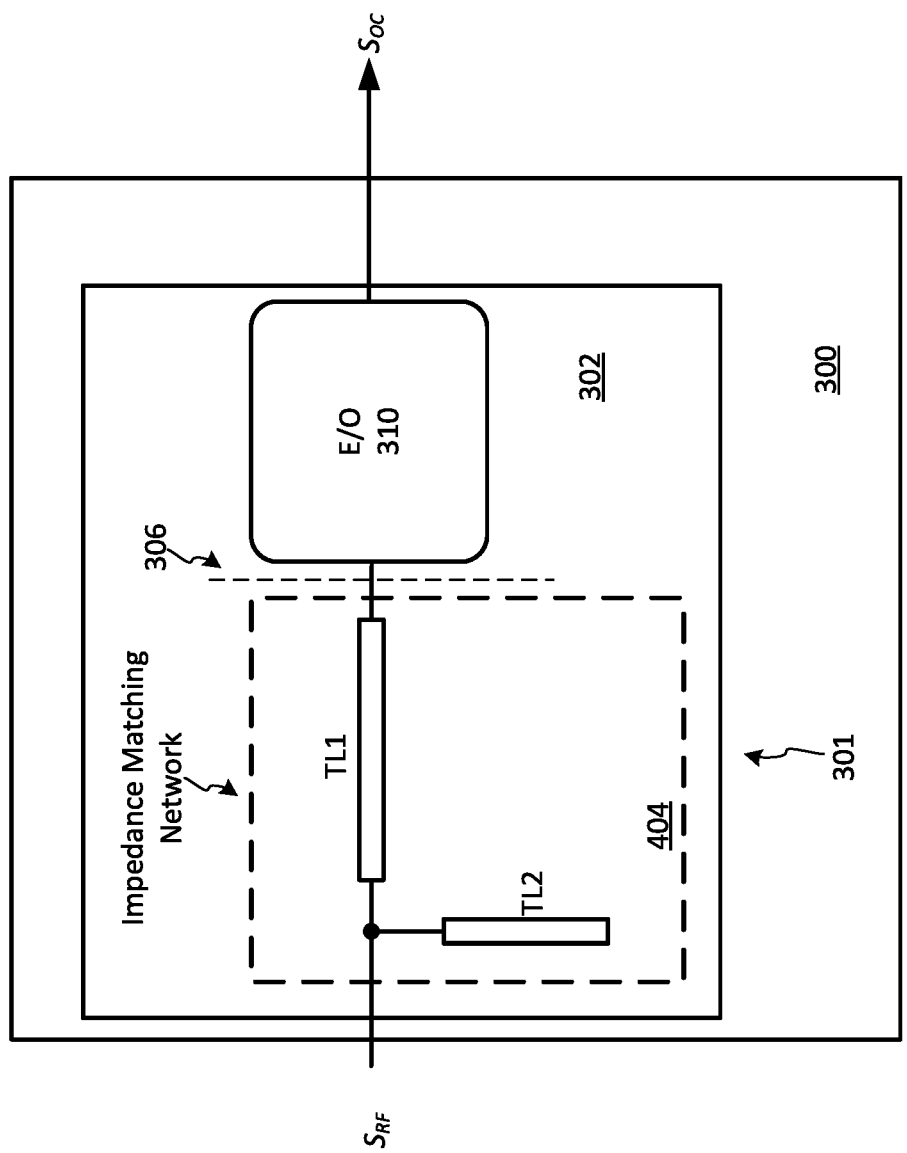
FIG. 4 is a schematic drawing which is useful for understanding an alternative to the impedance matching arrangement shown in FIG. 3.

In the solution disclosed herein, photonic device performance is improved by placing electrical impedance matching circuits in proximity to the photonic device. This can be accomplished without altering any of the photonic structure or design. The electrical frequency bandwidth over which the photonic component can function is broadened, thus making higher data rates and higher carrier frequencies achievable. This arrangement is illustrated in FIG. 3 with respect to a hybrid PIC 300 comprising photonic substrates 300, 302 and including an EO conversion device 310. In this example, the EO conversion device 310 is assumed to be an optical modulator that receives as an input a modulated RF signal $S_{RF}$ (which may be a microwave or millimeter wave signal) and converts it to a modulated optical carrier $S_{oc}$. An electrical impedance matching network 304 in this scenario is disposed on the photonic substrate 302, and connected directly at an impedance boundary 306 where the RF is coupled to the EO 310. The electrical impedance matching network in this scenario is comprised of lumped elements, including capacitor C1 and inductors L1, L2. However, the network shown is merely presented as one possible example and the solution is not limited with regard to the type of matching network which can be used. For example, in another scenario in FIG. 4, an impedance matching network 404 can be comprised of distributed matching elements, such as transmission lines TL1, TL2. In still other scenarios, a combination of lumped and distributed elements can be used to facilitate impedance matching.

Figure 5:
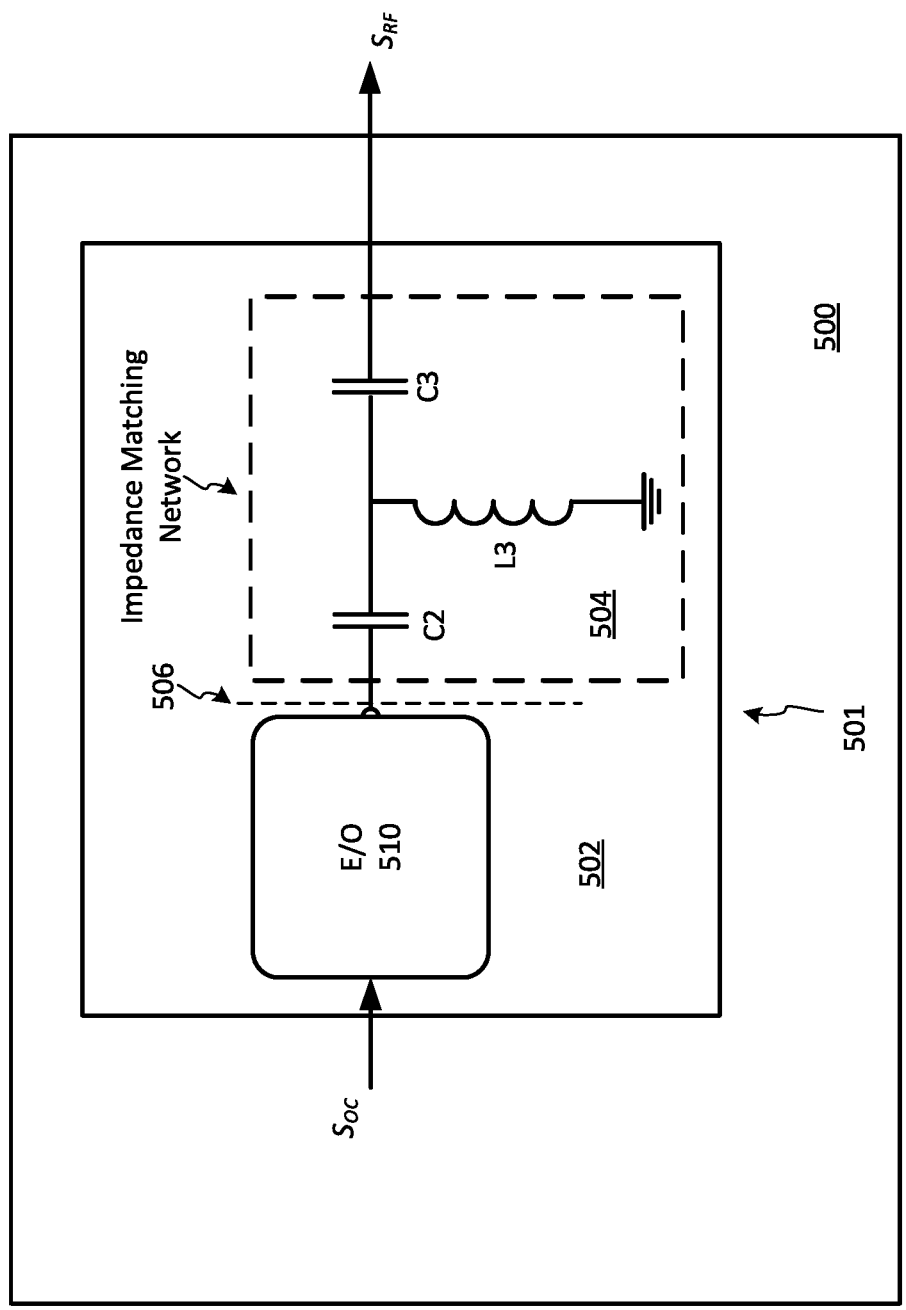
FIG. 5 is a schematic drawing which is useful for understanding how impedance matching at an output of a photonic integrated circuit can be performed on a photonic substrate at an impedance boundary of an electro-optic device.

Similar arrangements are possible to facilitate impedance matching when transitioning from the optical domain to the electrical domain. Such an arrangement is illustrated in FIG. 5 with respect to a hybrid PIC 500 comprising photonic substrates 500, 502 and including an EO conversion device 510. In this example, the EO conversion device 510 is assumed to be a photodetector comprised of a photodiode that receives as an input a modulated optical carrier signal $S_{oc}$ and converts it to a modulated optical carrier $S_{RF}$ (which may be a microwave or millimeter wave signal). An electrical impedance matching network 504 in this scenario is disposed on the photonic substrate 502, and connected directly at an impedance boundary 506 at the RF output of the EO 510. The electrical impedance matching network in this scenario is comprised of lumped elements, including capacitors C2, C3 and inductor L3. However, the network shown is merely presented as one possible example and the solution is not limited with regard to the type of matching network which can be used. As explained with respect to FIG. 4, distributed elements can also be used on the photonic substrate for this purpose.

Figure 6A:
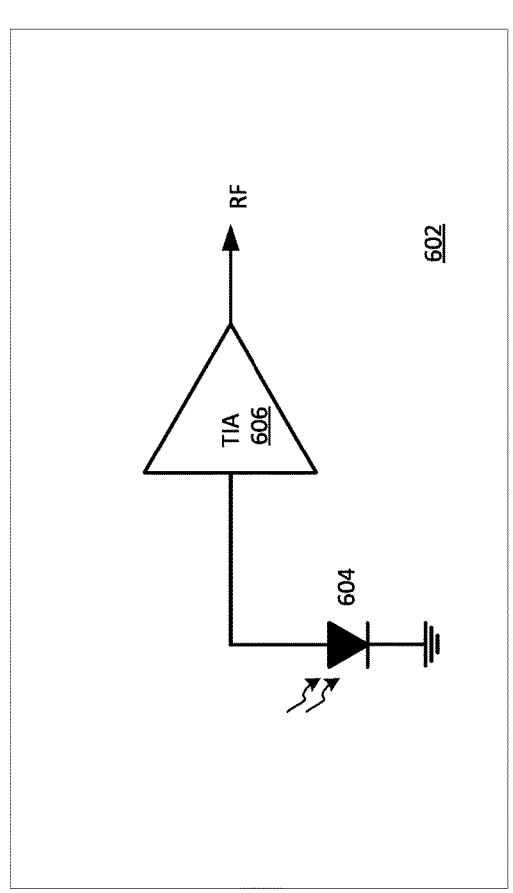
FIG. 6A and FIG. 6B are a series of drawings which are useful for understanding how impedance matching at an output of a photodiode can improve system performance in photonic integrated circuit.

The advantages of on-chip impedance matching on the PIC substrate can be further extended to scenarios shown in FIG. 6A which shows a conventional photodiode 604 in a PIC 600. In this scenario, the photodiode is disposed on a photonic substrate 602, and operating as a photodetector to convert a modulated optical carrier to an microwave or millimeter wave RF signal. The output of the photodiode is a relatively low voltage and therefore a transimpedance amplifier (TIA) 606 is provided to increase the voltage. Transimpedance amplifiers are used to convert the small current at the high impedance output of the photodiode to a target voltage with a 50 ohm impedance at the TIA output. But they have the drawback of degrading noise figure as frequency increases, whereas the photodiode itself suffers no such restriction.

Figure 6B:
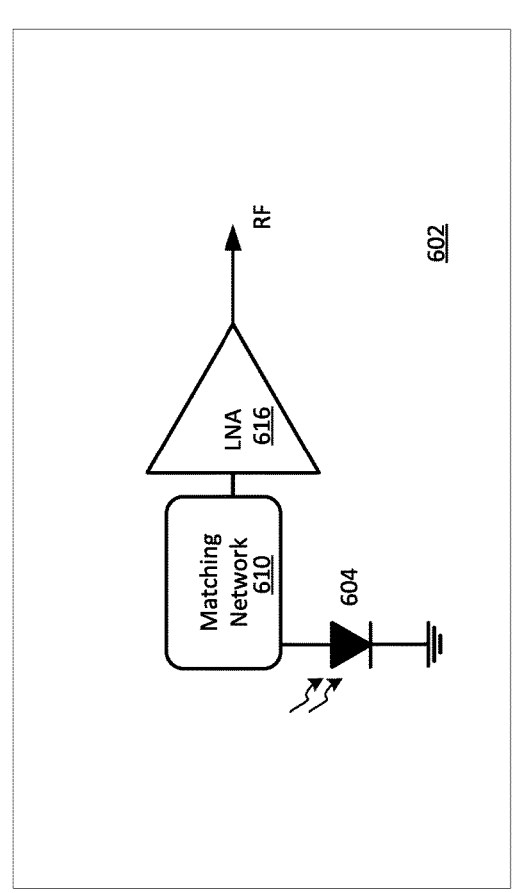

However, if output impedance matching is applied at the output of the photodiode, we can eliminate use of the transimpedance amplifier and instead use a low noise amplifier (LNA). Such an arrangement is shown in FIG. 6B which includes an impedance matching network 610 and LNA 616 in place of the TIA. The LNA 616 will have a lower noise figure (NF) as compared to a conventional TIA. The TIA is a very broadband device that amplifies noise from DC to data rate. But this is undesirable when the photodiode is converting and providing as an output an RF modulated optical carrier. In such scenarios where the signal being processed is comprised of defined passband around a carrier, it is preferable to replace the TIA with a combination of an impedance matching network and conventional LNA. From the foregoing, it will be understood that impedance matching directly on a photonic substrate as described herein can provide several advantages. However, at microwave and mm-wave frequencies which are commonly used with optical systems the actual implementation of such impedance matching can be technically challenging. This is primarily due to a combination of factors involving the physical size of components which are needed and the low resistivity of the optical substrates on which such components are disposed.

Photonic die sizes can be dimensionally on the same order of magnitude as the RF signal wavelength (e.g., approximately 1 mm). This design factor can limit the types of passive components that can be applied for purposes of providing matching circuits. Distributed style passive components are wavelength-dependent and typically consist of transmission lines having lengths which extend one more wavelength. Limiting a matching circuit design to the size of one wavelength (as would be the case in a scenario involving a 1 mm square photonic die) can greatly diminish the utility of this type of circuit. Accordingly, for purposes of the on-chip impedance matching lumped element components are advantageously utilized.

Examples of suitable impedance matching lumped element RF components can comprise inductors and capacitors. Semiconductor device fabrication processes are well known in the art and therefore will not be described here in detail. However, it should be appreciated that the lumped element RF components can be two-dimensional planar components formed from a metallization layer disposed directly on the surface of the Silicon photonic substrate. In the case of lumped element inductors, suitable two-dimensional configurations can include spiral inductors (e.g. spiral inductors formed in a rectangular, circular or octagonal shape). Other lumped element inductor arrangements are also possible and the types of inductors which can be used are not limited to planar components. For example, three-dimensional inductor topologies can be implemented on a substrate such as Silicon. Such three-dimensional topologies can include helical inductors built up on the substrate from a plurality of insulator and metallization layers which are interconnected with conductive vias. Lumped element capacitors can comprise various planar structures including those formed as interdigital structures.

The lumped element types of impedance matching components referenced herein can facilitate devices having a relatively large reactance value in a comparatively smaller space as compared to distributed element types of components. As such, a lumped element component can facilitate an impedance matching circuit that is much smaller in size than the signal wavelength. Accordingly, a lumped element approach is potentially suitable for RF impedance matching directly on the photonic substrate.

Silicon on Insulator (SOI) technology facilitates combining of electrical and optical circuits on a single chip. SOI device fabrication methods are well-known and therefore will not be described here in detail. However, it will be appreciate that such SOI devices are constructed upon a silicon wafer substrate and are known to utilize an isolating material ($SiO_2$) which is disposed between the silicon substrate and a very thin device layer. In an SOI device, the optical index difference of the silicon device layer as compared to the $SiO_2$ layer can be used to fabricate optical waveguides. But conventional silicon substrates can have resistivity in the 1 to 20 ohm-cm range. Substrates having resistivity values in this range are normally not considered useful for construction of passive components due to the relatively large signal loss that will result when signals propagate along such substrates.

Accordingly, in order to fabricate passive devices such as lumped element components, various techniques can be applied to alleviate the problem of dielectric loss. In some scenarios, dielectric loss can be mitigated by micro-machining the substrate underneath a device component, such that the dielectric contribution to loss becomes closer to that of air. Another approach is to design the passive structure in such a way as to move the electric field out of the high loss bulk Si substrate and into a lower loss $SiO_2$ of the device layer. Inductors and capacitors formed on a photonic substrate can benefit from such techniques.

To the extent that transmission lines are present on the photonic substrate, coplanar type RF transmission structures can be utilized advantageously. In coplanar type transmission line structures an electrical ground for the transmission line is always son the same layer as signal. This is to be distinguished from other types of transmission line, such as microstrip, where the ground is beneath the signal. Such a coplanar transmission line configuration can advantageously force the electric field to exist primarily between the two conductors on the SOI device top layers which are composed of $SiO_2$.

From the foregoing discussion it will be understood that impedance matching performed on a photonic substrate is advantageously performed using lumped element components. Still, it should be understood that the solutions presented herein are not limited in this regard and in some scenarios, distributed element components can also be used to facilitate the requirements of impedance matching. In other scenarios a combination of lumped element components and distributed components can be used to implement a matching network.

Reference throughout this specification to features, advantages, or similar language does not imply that all the features and advantages that may be realized should be or are in any single embodiment. Rather, language referring to the features and advantages is understood to mean that a specific feature, advantage, or characteristic described in connection with a particular implementation is included in at least one embodiment. Thus, discussions of the features and advantages, and similar language, throughout the specification may, but do not necessarily, refer to the same embodiment.

We claim:

1. A method for improving performance of a photonic integrated circuit, comprising:
performing one or more optical processing operations in a photonic integrated circuit (PIC) disposed on at least one optical media substrate;
using at least one electro-optic (EO) device included in the PIC to perform at least one EO conversion operation whereby an information signal is transitioned from a first signal carrier type to a second signal carrier type different from the first signal carrier type;
increasing an operating bandwidth of the PIC by performing broadband electrical signal impedance matching operations directly on the at least one optical media substrate to improve a radio frequency (RF) electrical impedance match between the EO device and a second device exclusive of the PIC;
wherein the first and second signal carrier types are selected from the group consisting of an optical signal carrier and an RF electrical signal carrier in the microwave or millimeter wave frequency range.

2. The method according to claim 1, further comprising performing the EO conversion operation and the electrical signal impedance matching operations on the same optical media substrate.

3. The method according to claim 2, further comprising performing the electrical signal impedance matching operation directly at the impedance mismatch boundary associated with the EO device.

4. The method according to claim 3, wherein the EO device is selected from the group consisting of an optical modulator and a photo-diode.

5. The method according to claim 4, wherein the EO device is an optical modulator and the impedance matching operations comprise improving the electrical impedance match of an input electrical impedance of the optical modulator relative to an output electrical impedance of the second device.

6. The method according to claim 4, wherein the EO device is a photo-diode operating as a photodetector in the PIC, and the impedance matching operations comprise matching an output electrical impedance of the photo-diode to an input electrical impedance of the second device.

7. The method according to claim 1, further comprising performing the electrical signal impedance matching operations using one or more discrete lumped element electronic components disposed on the optical media substrate and selected from the group consisting of an inductor, a capacitor, and a resistor.

8. The method according to claim 7, further comprising forming the discrete electronic components with physical dimensions that are less than 0.25$\lambda$, where $\lambda$ is the wavelength of the electrical signal carrier.

9. The method according to claim 1, further comprising performing the electrical signal impedance matching operations using at least one distributed element.

10. The method according to claim 9, further comprising using at least one electrical transmission line as the distributed element.

11. A photonic integrated circuit (PIC), comprising:
at least one optical media substrate;
a plurality of optical processing elements disposed on the at least one optical media substrate, including at least one electro-optic (EO) device;
the EO device configured to perform at least one EO conversion operation in which an information signal is transitioned from a first signal carrier type to a second signal carrier type different from the first signal carrier type; and
an electrical impedance matching network disposed directly on the at least one optical media substrate and configured to facilitate a broadband radio frequency (RF) electrical impedance match between the EO device and a second device exclusive of the PIC;
wherein the first and second signal carrier types are selected from the group consisting of an optical signal carrier and an RF electrical signal carrier in the microwave or millimeter wave frequency range.

12. The PIC according to claim 11, wherein the EO device and the electrical impedance matching network are disposed on the same optical media substrate.

13. The PIC according to claim 12, wherein the electrical impedance matching network is disposed directly at the impedance mismatch boundary associated with the EO device.

14. The PIC according to claim 13, wherein the EO device is selected from the group consisting of an optical modulator and a photo-diode.

15. The PIC according to claim 14, wherein the EO device is an optical modulator and the electrical impedance matching network is configured to improve the electrical impedance match of an input electrical impedance of the optical modulator relative to an output electrical impedance of the second device.

16. The PIC according to claim 14, wherein the EO device is a photo-diode operating as a photodetector in the PIC, and the electrical impedance matching network is configured to match an output electrical impedance of the photo-diode to an input electrical impedance of the second device.

17. The PIC according to claim 11, wherein the electrical impedance matching network is comprised of one or more discrete lumped element electronic components disposed on the optical media substrate and selected from the group consisting of an inductor, and a capacitor, and a resistor.

18. The PIC according to claim 17, wherein the discrete lumped element electronic components have physical dimensions that are less than 0.25$\lambda$, where $\lambda$ is the wavelength of the electrical signal carrier.

19. The PIC according to claim 11, wherein the electrical impedance matching network is comprised of at least one reactive element which is a distributed element.

20. The PIC according to claim 19, wherein the distributed element is a transmission line element.

* * * * *